US008924446B2

(12) United States Patent
Thomas et al.

(10) Patent No.: US 8,924,446 B2
(45) Date of Patent: Dec. 30, 2014

(54) COMPRESSION OF SMALL STRINGS

(75) Inventors: Matthew Thomas, Atlanta, GA (US); Benoit Perroud, Villars-sur-Glane (CH)

(73) Assignee: Verisign, Inc., Reston, VA (US)

( * ) Notice: Subject to any disclaimer, the term of this patent is extended or adjusted under 35 U.S.C. 154(b) by 319 days.

(21) Appl. No.: 13/339,562

(22) Filed: Dec. 29, 2011

(65) Prior Publication Data

US 2013/0173676 A1 Jul. 4, 2013

(51) Int. Cl.
*H03M 7/30* (2006.01)

(52) U.S. Cl.
USPC .......... 708/203

(58) Field of Classification Search
CPC ....... H03M 7/30; H03M 7/3088; H03M 7/70; H03M 7/705
USPC .......... 708/203
See application file for complete search history.

(56) References Cited

U.S. PATENT DOCUMENTS 5,023,610 A 6/1991 Rubow et al.
5,974,180 A 10/1999 Schwendeman
6,502,064 B1 12/2002 Miyahira et al.
7,031,910 B2 4/2006 Eisele
7,711,542 B2 5/2010 Fux et al.
7,809,553 B2 10/2010 Fux et al.
7,925,652 B2 4/2011 Merz et al.
2008/0091427 A1* 4/2008 Olsen .......... 704/254
2013/0013574 A1* 1/2013 Wu .......... 707/693

FOREIGN PATENT DOCUMENTS

EP 1 808 749 7/2007
WO WO 2006/024147 3/2006

OTHER PUBLICATIONS

Chia-Yuen Teng et al., "An Improved Hierarchical Lossless Text Compression Algorithm", DCC '95 Proceedings of the Conference on Data Compression, 1995, pp. 292-301.
Extended European Search Report dated Jul. 15, 2014, European Application No. 12197316.8 filed Dec. 14, 2012, pp. 1-4.

* cited by examiner

*Primary Examiner* — Chuong D Ngo
(74) *Attorney, Agent, or Firm* — MH2 Technology Law Group, LLP

(57) ABSTRACT

A method for compressing a set of small strings may include calculating n-gram frequencies for a plurality of n-grams over the set of small strings, selecting a subset of n-grams from the plurality of n-grams based on the calculated n-gram frequencies, defining a mapping table that maps each n-gram of the subset of n-grams to a unique code, and compressing the set of small strings by replacing n-grams within each small string in the set of small strings with corresponding unique codes from the mapping table. The method may use linear optimization to select a subset of n-grams that achieves a maximum space saving amount over the set of small strings for inclusion in the mapping table. The unique codes may be variable-length one or two byte codes. The set of small strings may be domain names.

20 Claims, 5 Drawing Sheets

200
START
210 Receive Small String
220 Calculate n-gram Frequencies over the Set of Small Strings
230 Select a Subset of n-grams
240 Define a Mapping Table of n-grams to Unique Codes
250 Compress the Set of Small Strings
260 Output/Store Compressed Set of Small Strings
END

500

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | a | b | c | d | e | f | g | h | i | j | k | l | m | n | o | p |
| 1 | q | r | s | t | u | v | w | x | y | z | 0 | 1 | 2 | 3 | 4 | 5 |
| 2 | 6 | 7 | 8 | 9 | - | the | ea | ion | ee | ing | sh | to | but | do | and | it |
| 3 | any | er | in | sion | st | oo | she | on | wh | tion | its | he | cha | . | . | . |
| 4 | . | . | . | . | . | . | . | . | . | . | . | . | . | . | . | . |
| 5 | . | . | . | . | . | . | . | . | . | . | . | . | . | . | . | . |
| 6 | . | . | . | . | . | . | . | . | . | . | . | . | . | . | . | . |
| 7 | . | . | . | . | . | . | . | . | . | . | . | . | . | . | . | . |
| 8 | . | . | . | . | . | . | . | . | . | . | . | . | . | . | . | . |
| 9 | . | . | . | . | . | . | . | . | . | . | . | . | . | . | . | . |
| A | . | . | . | . | . | . | . | . | . | . | . | . | . | . | . | . |
| B | . | . | . | . | . | . | . | . | . | . | . | . | . | . | . | . |
| C | . | . | . | . | . | . | . | . | . | . | . | . | . | . | . | . |
| D | . | . | . | . | . | . | . | . | . | . | . | . | . | . | . | . |
| E | . | . | . | . | . | . | . | . | . | . | . | . | . | . | . | . |
| F | . | . | . | . | . | . | . | . | . | . | . | . | . | . | . | . |

COMPRESSION OF SMALL STRINGS

This disclosure is directed to methods, systems, and non-transitory computer-readable storage media storing programs for compressing a set of small strings.

BACKGROUND

There is often a need to operate on or use a list of small strings, such as domain names, as a single set of data that may be loaded into memory. For example, when working with domain names, there arises at times a need to operate on or use a list of all domain names, or at least a large subset of domain names. However, due to the large number of domain names (on the order of 100 million), when operating on or accessing a list of all domain names, the operation may be limited by available memory. Thus, it becomes important to reduce the memory requirement in such an operation by compressing the domain names within the list.

General purpose compression algorithms that are effective with larger documents or files (such as the LZ family of compression algorithms) may be less effective with small strings, and may even result in larger "compressed" files or outputs. Accordingly, to effectively reduce the size of the domain names list and corresponding memory required to retain the domain names in memory, a new compression scheme tailored to small strings was developed by the inventors, specifically taking advantage of unique features of small strings, domain names in particular.

Domain names are typically limited to letters (A-Z, not case-sensitive), numbers (0-9), and hyphens (-), for a total of 37 possible characters. Domain names also typically contain 63 or fewer characters. Thus, the set of characters required to represent domain names is limited. Other sets of small strings may possess similar characteristics as domain names that limit the number of characters required to fully represent the small strings. Small strings may be defined as strings with limited length and/or limited character sets forming the strings. This is as opposed to, for example, lengthy strings that may require a large character set for representation, such as large, complex documents or high-quality photographs. Examples of small strings may include domain names and physical addresses which may be strings with limited length, DNA sequences which may be strings with a limited character set forming the strings, and phone numbers which may be both strings with limited length and a limited character set forming the strings.

Accordingly, it is an object of embodiments of the disclosure to provide methods, systems, and non-transitory computer-readable storage media storing programs for compressing a set of small strings. Other objects and advantages of embodiments of the disclosure may be apparent in view the description of exemplary embodiments below.

SUMMARY

In accordance with an embodiment, a computer-implemented method for compressing a set of small strings may be provided, the method comprising: (1) calculating, by a processor, n-gram frequencies for a plurality of n-grams over the set of small strings; (2) selecting, by the processor, a subset of n-grams from the plurality of n-grams based on the calculated n-gram frequencies; (3) defining, by the processor, a mapping table that maps each n-gram of the subset of n-grams to a unique code; and (4) compressing, by the processor, the set of small strings by replacing n-grams within each small string in the set of small strings with corresponding unique codes from the mapping table.

In the embodiment, the selecting may also include calculating, by the processor, a space saving amount for each n-gram of the plurality of n-grams as a product of (i) the n-gram frequency and (ii) a difference between a character length of the n-gram and a length of the unique codes. The selecting may also include selecting a number of the n-grams with the highest calculated space saving amount as the subset of n-grams.

In the embodiment, overlapping n-grams may be removed from the selected subset of n-grams.

In the embodiment, the selecting may also include calculating, by the processor, a space saving amount for each n-gram of the plurality of n-grams as a product of (i) the n-gram frequency and (ii) a difference between a character length of the n-gram and a length of the unique codes, and using linear optimization to determine and select the subset of n-grams from the plurality of n-grams that achieves a maximum space saving amount over the set of small strings. The constraints for the linear optimization may include selecting only one n-gram from a set of overlapping n-grams.

In the embodiment, the mapping table may contain 256 entries and the unique codes may be fixed single byte codes.

In the embodiment, the mapping table may contain 65536 entries and the unique codes may be fixed 2-byte codes.

In the embodiment, the unique codes may be variable-length one or two byte codes.

In the embodiment, the method may also include determining, by the processor, an optimum length for the unique codes. The determining may include calculating a space saving amount over a subset of small strings from the set of small strings for each of at least two different unique code lengths, and selecting as the optimum length the unique code length with the maximum space saving amount over the subset of small strings. The unique codes may be the optimum length.

In the embodiment, the at least two different unique code lengths may include: (1) fixed single byte codes, (2) fixed 2-byte codes, and (3) variable-length one or two byte codes.

In the embodiment, the subset of small strings from the set of small strings may include the whole set of small strings.

In the embodiment, the compressing may also include, for each small string in the set of small strings, replacing n-grams within the small string with corresponding unique codes from the mapping table starting with the longest n-gram appearing in both the small string and the mapping table first.

In the embodiment, the set of small strings may be a set of domain names.

In another embodiment, a system for compressing a set of small strings is provided, and the system may include a processor and a memory connected to the processor, the memory storing instructions to direct the processor to perform operations including: (1) calculating n-gram frequencies for a plurality of n-grams over the set of small strings; (2) selecting a subset of n-grams from the plurality of n-grams based on the calculated n-gram frequencies; (3) defining a mapping table that maps each n-gram of the subset of n-grams to a unique code; and (4) compressing the set of small strings by replacing n-grams within each small string in the set of small strings with corresponding unique codes from the mapping table.

In the embodiment, the selecting may also include calculating a space saving amount for each n-gram of the plurality of n-grams as a product of (i) the n-gram frequency and (ii) a difference between a character length of the n-gram and a length of the unique codes, and using linear optimization to determine and select the subset of n-grams from the plurality of n-grams that achieves a maximum space saving amount over the set of small strings. The constraints for the linear optimization may include selecting only one n-gram from a set of overlapping n-grams.

In the embodiment, the unique codes may be variable-length one or two byte codes.

In the embodiment, the memory may store further instructions to direct the processor to perform operations including determining an optimum length for the unique codes. The determining may include calculating a space saving amount over a subset of small strings from the set of small strings for each of at least two different unique code lengths, and selecting as the optimum length the unique code length with the maximum space saving amount over the subset of small strings. The unique codes may be the optimum length.

In another embodiment, a non-transitory computer-readable storage medium storing instructions for compressing a set of small strings is provided. The instructions may cause one or more computer processors to perform operations according to a method. The method may include: (1) calculating n-gram frequencies for a plurality of n-grams over the set of small strings; (2) selecting a subset of n-grams from the plurality of n-grams based on the calculated n-gram frequencies; (3) defining a mapping table that maps each n-gram of the subset of n-grams to a unique code; and (4) compressing the set of small strings by replacing n-grams within each small string in the set of small strings with corresponding unique codes from the mapping table.

In the embodiment, the selecting may also include calculating a space saving amount for each n-gram of the plurality of n-grams as a product of (i) the n-gram frequency and (ii) a difference between a character length of the n-gram and a length of the unique codes, and using linear optimization to determine and select the subset of n-grams from the plurality of n-grams that achieves a maximum space saving amount over the set of small strings. The constraints for the linear optimization may include selecting only one n-gram from a set of overlapping n-grams.

In the embodiment, the unique codes may be variable-length one or two byte codes.

In the embodiment, the method may also include determining an optimum length for the unique codes. The determining may include calculating a space saving amount over a subset of small strings from the set of small strings for each of at least two different unique code lengths, and selecting as the optimum length the unique code length with the maximum space saving amount over the subset of small strings. The unique codes may be the optimum length.

Additional objects and advantages of the invention will be set forth in part in the description which follows, and in part will be obvious from the description, or may be learned by practice of the embodiments of the disclosure. The objects and advantages of the embodiments will be realized and attained by means of the elements and combinations particularly pointed out in the appended claims.

It is to be understood that both the foregoing general description and the following detailed description are exemplary and explanatory only and are not restrictive of the embodiments, as claimed.

The accompanying drawings, which are incorporated in and constitute a part of this specification, illustrate embodiments of the invention and together with the description, serve to explain the principles of the embodiments of the disclosure.

DESCRIPTION OF EXEMPLARY EMBODIMENTS

Reference will now be made in detail to the present exemplary embodiments of the disclosure, examples of which are illustrated in the accompanying drawings. Wherever possible, the same or similar reference numbers will be used throughout the drawings to refer to the same or like parts.

Figure 1:
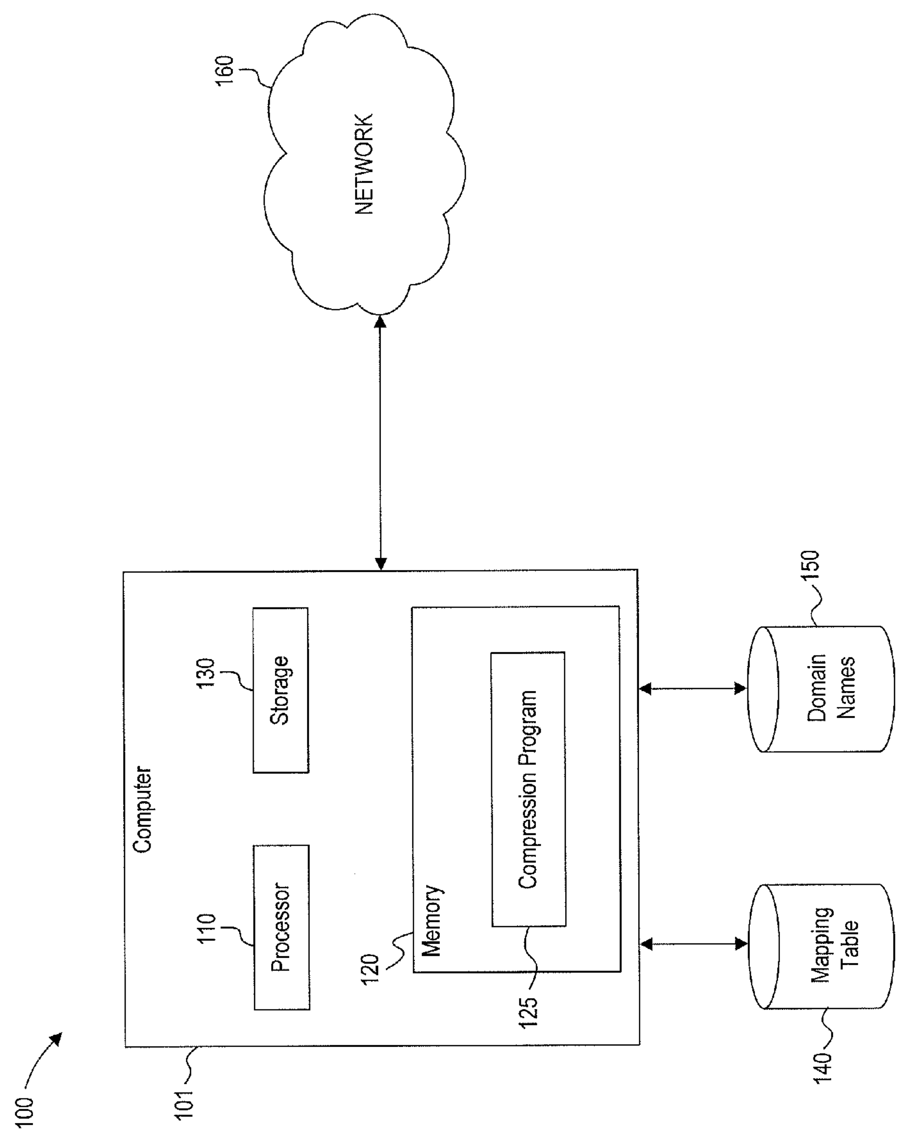
FIG. 1 is diagram illustrating an exemplary system 100 for compressing a set of small strings.

FIG. 1 is diagram illustrating an exemplary system 100 for compressing a set of small strings. The exemplary system 100 includes exemplary system components that may be used. The components and arrangement, however, may be varied.

A computer 101 may include a processor 110, a memory 120, storage 130, and input/output (I/O) devices (not shown). The computer 101 may be implemented in various ways. For example, the computer 101 may be a general purpose computer, a server, a mainframe computer, any combination of these components, or any other appropriate computing device. The computer 101 may be standalone, or may be part of a subsystem, which may, in turn, be part of a larger system.

The system 100 may also include a mapping table 140 and a domain names database 150. Although FIG. 1 illustrates the computer 101, the mapping table 140, and the domain names database 150 as separate components, the mapping table 140 and/or the domain names database 150 may alternatively be integrated with the computer 101. Additionally, the mapping table 140 and the domain names database 150 may be integrated into a single database or stored in a same memory device. The domain names database 150 may be, in other embodiments, a database of other small strings such as addresses, personal names, company names, etc. that will be the subject of the compression.

The processor 110 may include one or more known processing devices, such as a microprocessor from the Pentium™ or Xeon™ family manufactured by Intel™, the Turion™ family manufactured by AMD™, or any of various processors manufactured by Sun Microsystems. Memory 120 may include one or more storage devices configured to store information used by processor 110 to perform certain functions related to disclosed embodiments. Storage 130 may include a volatile or non-volatile, magnetic, semiconductor, tape, optical, removable, non-removable, or other type of computer-readable medium used as a storage device.

In one embodiment, memory 120 may include one or more programs or subprograms that may be loaded from storage 130 or elsewhere that, when executed by computer 101, perform various procedures, operations, or processes consistent with disclosed embodiments. For example, memory 120 may include a compression of small strings program 125 for compressing a set of small strings according to disclosed embodiments. Memory 120 may also include other programs that perform other functions and processes, such as programs that provide communication support, Internet access, etc. and a program for decoding, accessing, and/or searching the compressed strings. The compression of small strings program 125 may be embodied as a single program, or alternatively, may include multiple sub-programs that, when executed, operate together to perform the function of the compression of small strings program 125 according to disclosed embodiments.

The computer 101 may communicate over a link with a network 160. For example, the link may be a direct communication link, a LAN, a WAN, or other suitable connection. The network 160 may include the internet.

The computer 101 may include one or more I/O devices (not shown) that allow data to be received and/or transmitted by the computer 101. I/O devices may also include one or more digital and/or analog communication input/output devices that allow the computer 101 to communicate with other machines and devices. I/O devices may also include input devices such as a keyboard or a mouse, and may include output devices such as a display or a printer. The computer 101 may receive data from external machines and devices and output data to external machines and devices via I/O devices. The configuration and number of input and/or output devices incorporated in I/O devices may vary as appropriate for various embodiments.

As illustrated in FIG. 1, the computer 101 may also be communicatively connected to one or more data repositories, for example, the mapping table 140 and/or the domain names database 150.

An exemplary use of the system 100 will now be described by way of example with reference to the method illustrated in FIG. 2

Figure 2:
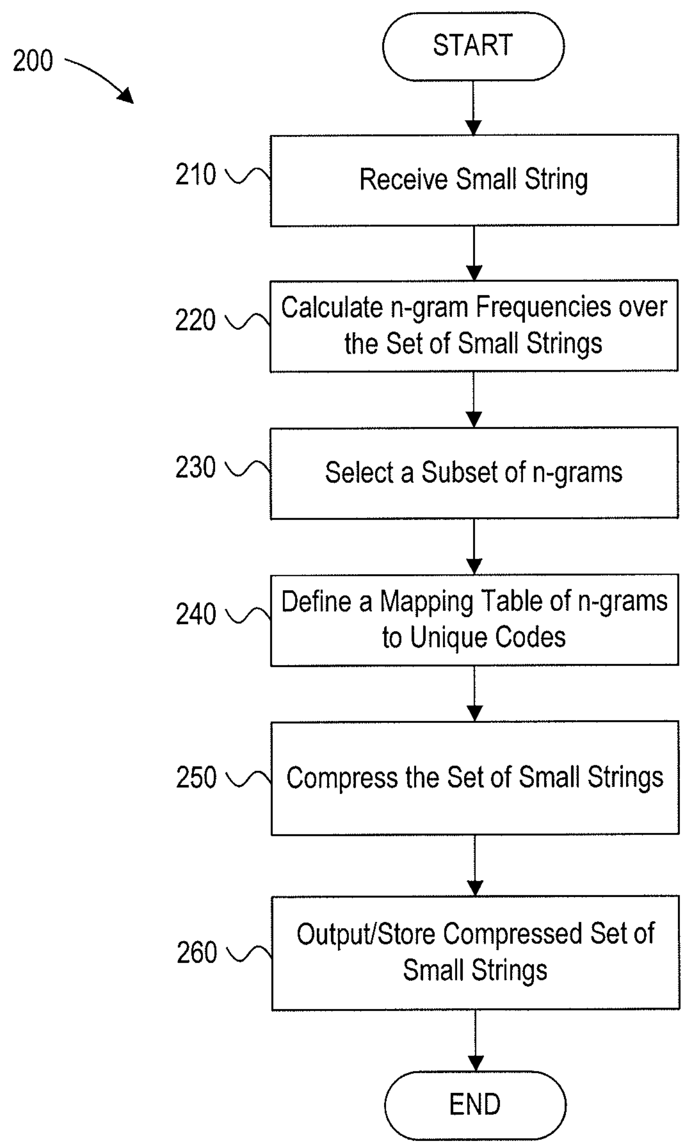
FIG. 2 is an exemplary illustration of a method for compressing a set of small strings.

FIG. 2 is an illustration of an exemplary method 200 for compressing a set of small strings. The exemplary method 200 illustrated in FIG. 2 can be carried out, for example, using the system 100 illustrated in FIG. 1, described above. Accordingly, the following description of the method 200 for compressing a set of small strings refers to the components of the system 100 illustrated in FIG. 1. However, the method could be performed by other components or arrangements of components not specifically illustrated in FIG. 1.

In step 210, the computer 101 may obtain a set of small strings for compression. The set of small strings may be input by a user, may be received from the network 160, may be loaded from memory 120 or storage 130, or may be obtained by other means. In one embodiment, the set of small strings is a set of domain names. The domain names may be obtained from the domain names database 150, or some other source of domain names. The set may include all domain names, domain names in a specific top-level domain (.com, .net, etc.), or a subset of domain names. The domain names may be currently registered domain names, previously registered domain names, or unregistered domain names that have been frequently searched, or requested or suggested for registering.

While in this exemplary method the computer 101 is described as carrying out certain steps, the processor 120, other components of the computer 101, or other known components not specifically illustrated, could be used to perform the method steps. The computer 101 may be a personal computer, a server, an application specific integrated circuit (ASIC), a field programmable gate array (FPGA), or any other appropriate computing device.

In step 220, the computer 101 may calculate n-gram frequencies over the set of small strings. Calculating the n-gram frequencies may include counting the total frequency of occurrences of specific n-grams in the small strings of the set of small strings. An exemplary method for calculating n-gram frequencies is described with respect to FIG. 3.

In step 230, the computer 101 may select a subset of n-grams. The n-grams may be selected for inclusion in a mapping table. The subset of n-grams may be selected based on the n-gram frequencies calculated in step 220. The number of n-grams selected may be based on a size of a mapping table and/or a length of a unique code that is used to represent the n-grams. An exemplary method for selecting the subset of n-grams is described with respect to FIG. 4.

In step 240, the computer 101 may define a mapping table of n-grams to unique codes. The mapping table may include a pre-defined number of entries. The pre-defined number of entries may be based on the length of the unique code. For example, in one embodiment the unique code used to identify a specific n-gram or entry in the mapping table may be one byte, in which case the mapping table may have 256 entries. In another embodiment, the unique code may be two bytes, in which case the mapping table may have 65536 entries. In yet another embodiment, the unique code may be a variable-length one or two byte code, in which case the mapping table may have 32896 entries. In yet another embodiment, the unique code may be a variable-length one or more byte code, in which case the mapping table may have an appropriate number of entries to accommodate entries for each of the unique codes. An exemplary graphical illustration of the mapping table is described with respect to FIG. 5.

In step 250, the computer 101 may compress or encode the set of small strings. The computer 101 may compress or encode the set of small strings by replacing n-grams in each small string that appear in the mapping table with the corresponding unique code for the n-gram. An exemplary method for compressing the set of small strings is described with respect to FIG. 6.

In step 260, the computer 101 may output the compressed set of small strings. The compressed small strings may be output as individual compressed small strings, or as the whole set of compressed small strings. The output may be to a display, to a network, or to a database. In step 260, the computer 101 may alternatively store the compressed set of small strings. The compressed set of small strings may be stored in the memory 120, the storage 130, or any other appropriate storage device. In another embodiment, the compressed set of small strings may be made available to another program that will operate on or otherwise make use of the compressed small strings.

The compressed set of small strings, or individual small strings, may be decompressed or decoded by replacing each unique code in the small string with the corresponding entry in the mapping table. In one embodiment, the small strings may be domain names, and the compressed set of domain names may be output to a program that searches the set of domain names.

Figure 3:
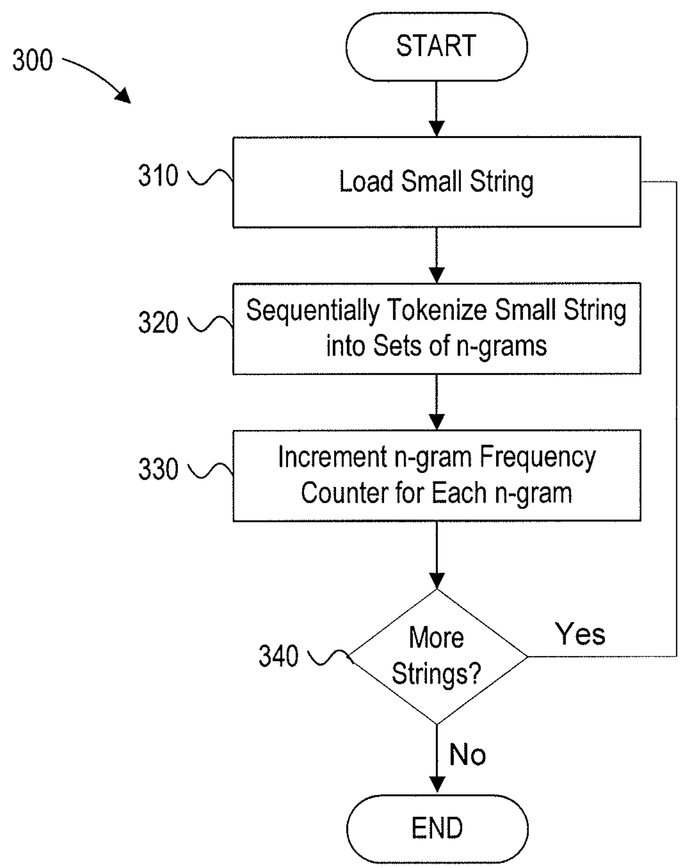
FIG. 3 is an exemplary illustration of a method for calculating n-gram frequencies over the set of small strings.

FIG. 3 illustrates a method 300 for calculating n-gram frequencies over the set of small strings. In step 310, the computer 101 loads a small string from the set of small strings. The method 300 may be repeated for each small string in the set of small strings.

In step 320, the computer 101 may sequentially tokenize the small string into a set of n-grams. Based on the sequential tokenization of the small string, in step 330, an n-gram frequency counter for each n-gram in the small string may be incremented. An example of these steps is illustrated below using the small string "hotpad"

| | | | | | | | |
|---|---|---|---|---|---|---|---|
| $n=1$ | *h* | *o* | *t* | *p* | *a* | *d* | (Example 1) |
| $n=2$ | *ho* | *ot* | *tp* | *pa* | *ad* | | |
| $n=3$ | hot | *otp* | *tpa* | pad | | | |
| $n=4$ | *hotp* | *otpa* | *tpad* | | | | |
| $n=5$ | *hotpa* | *otpad* | | | | | |
| $n=6$ | hotpad | | | | | | |

In this example, the small string "hotpad" is first tokenized into single character strings (n-grams where n=1). In one embodiment, this first step where n=1 may be omitted, and all single characters that form the strings in the small string set may be included in the mapping table. For example, in one embodiment, the small strings are domain names, and the set of characters that forms the domain names (A-Z, 0-9, and -) are included in the mapping table.

The sequential tokenization of the string "hotpad" in Example 1 continues by then tokenizing the small string "hotpad" into two character strings (n-grams where n=2). A counter for each of these n-grams in incremented to represent that the n-gram is present in this string.

Example 1 continues by tokenizing the small string "hotpad" into three, four, and five character strings, and incrementing the n-gram counters for each n-gram that is found. The sequential tokenization of "hotpad" in Example 1 ends when the size of the n-gram is the same as the size of the string being tokenized. The string may be considered an n-gram, and a corresponding n-gram counter for the small string may be incremented as described above. Although the above example describes a method of sequential tokenization that starts with shorter n-grams and works toward longer n-grams, the order may be reversed or otherwise ordered in alternative embodiments. For example, in one embodiment, the longest n-grams may be counted first.

In step 340, the computer 101 may determine whether all of the small strings within the set of small strings have been tokenized and had their n-grams counted. If there are small strings that still need to be processed, operation of the method may return to step 310 where a next small string may be loaded and the method repeated. If all of the small strings in the set of small strings have been processed, operation of the method may end. In one embodiment, operation of the method may proceed to step 230 in FIG. 2 if all of the small strings have been processed.

Figures 4, 5:
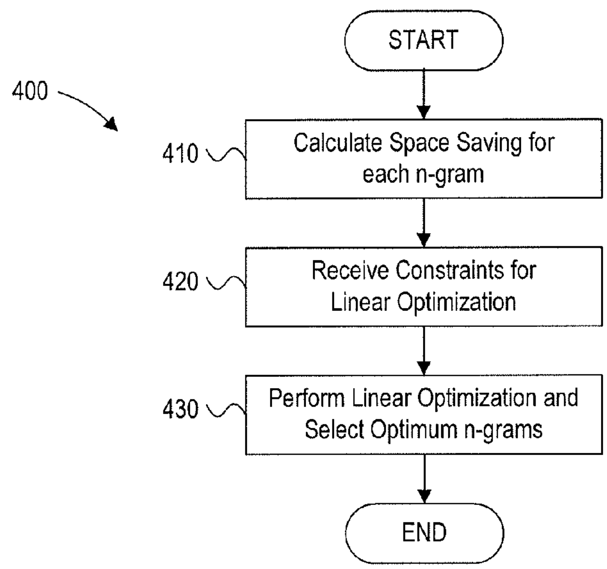
FIG. 4 is an exemplary illustration of a method for selecting a subset of n-grams to be included in the mapping table.
FIG. 5 is an exemplary graphical illustration of an exemplary mapping table for n-grams when using a 1-byte unique code.

FIG. 4 is an exemplary illustration of a method 400 for selecting a subset of n-grams to be included in the mapping table according to an embodiment. In step 410, the computer 101 may calculate a space saving amount for each n-gram. The space saving amount may be an amount of memory space saved by replacing an n-gram string with its corresponding unique code. In one embodiment, the space saving amount is calculated as the product of (1) the difference between the length of the n-gram and the unique code and (2) the frequency of the n-gram. For example, if the n-gram "ion" is represented using three bytes and appears in the set of small strings 1500 times (an n-gram frequency of 1500), and the unique code is one byte, the space saving amount would be (3−1)*(1500)=3000. The space saving amount may be a dimensionless number, or may be represented in bytes or other memory quantities. A space saving amount for each n-gram may be calculated and associated with its respective n-gram.

In step 420, the computer 101 may receive constraints that may be used in a linear optimization of the n-grams. Constraints may include, for example, limiting the number of overlapping n-grams, and limiting the total number of n-grams selected. Other constraints may be received or input to the computer 101 relating to a maximization function that may be used to select an optimum subset of n-grams.

In step 430, the computer 101 may use linear optimization or linear programming on a maximization function to determine the optimum n-grams to be selected for the subset to be included in the mapping table. The linear optimization may use known optimization techniques based on the constraints provided to the computer 101.

An example of the linear optimization is described below with reference to Example 2. In one embodiment, the computer 101 may carry out the linear optimization using equations and constraints as illustrated and described in Example 2.

Maximization Equation:

$$(a*v\_0)+(a*v\_1)+(a*v\_2)+\ldots+(a*v\_m) \qquad \text{(Example 2)}$$

where:

a represents the space saving amount of the $m^{th}$ n-gram;

v_m is either 1 or 0 and represents whether the mth n-gram is selected;

m represents the number of n-grams over the set of small strings.

Constraints:

$$v\_0 + v\_1 + v\_2 + v\_3 + \ldots + v\_m <= S$$

$$v\_5 + v\_6 <= 1$$

$$v\_12 + v\_15 + v\_22 <= 1$$

$$\ldots$$

$$v\_2 + v\_17 <= 1$$

where:

S represents the total number of available entries in the mapping table.

The maximization equation may be designed to maximize the space savings or compression over the set of small strings. The maximization equation may represent the sum of the space saving amount for each of the selected n-grams. The constraints may include a constraint that limits the total number of n-grams selected based on the number of available entries in the mapping table. The constraints may also include constraints that limit overlapping n-grams from being selected. The constraints may also include weighting certain variables to favor shorter or longer n-grams.

Overlapping n-grams are n-grams that are contained in other n-grams. For example, in Example 2 above, if v__5 represents "tion" and v__6 represents "ion", v__5 and v__6 are considered to be overlapping n-grams. The constraint v_+v__6<=1 limits the maximization function so that only at most one of "tion" and "ion" is selected. Similarly, in Example 2 above, if v__12 represents "ther", v__15 represents "her", and v__22 represents "he", the three n-grams are considered overlapping n-grams. The constraint v__12+v__15+v__22<=1 limits the maximization function so that only at most one of "ther", "her", and "he" is selected. In one embodiment, the constraint for sets of overlapping n-grams may allow more than one, but less than all of the overlapping n-grams to be selected. For example, the constraint of Example 2 may be v__12+v__15+v__22<=2 in another embodiment.

In one embodiment, the method 400 for selecting a subset of n-grams to be included in the mapping table may include only step 410, and the subset of n-grams may be selected based only on the space saving amount calculated for each n-gram. In this embodiment, the n-grams with the highest space saving amount are selected. The number of n-grams selected may depend on the size of the mapping table. The number of n-grams selected may also depend on the number of characters in the character set used to represent all of the small strings. In this embodiment, overlapping n-grams may be removed from the selected subset and replaced by the next highest ranking n-grams.

FIG. 5 is an exemplary graphical illustration of a mapping table 500 for n-grams according to embodiments of the disclosure. The mapping table 500 may be used when the compression uses a 1-byte unique code or 1-byte encoding. Each entry in the mapping table 500 is referenced by its unique code ranging from "00" to "FF", which may represent its place in the mapping table 500. For example, "a" is represented by the 1-byte code "00", "b" is represented by "01", "c" is represented by "02", etc. The n-grams are similarly referenced, for example, with "the" being represented by "25", "it" being represented by "2F", etc.

The selected subset of n-grams from step 230 in FIG. 2 may be mapped to a mapping table similar to the mapping table 500. The mapping table may also include entries for characters in the character set used to construct the set of small strings. The mapping table 500 in FIG. 5 may illustrate an embodiment where the small strings are domain names, and the character set used to construct the domain names includes the letters A-Z, the numbers 0-9, and the hyphen symbol (-). Because the character set for the small strings includes 37 characters, the mapping table 500 includes 37 entries for the individual characters, and 219 (256 minus 37) entries reserved for n-grams. In this embodiment, the computer 101 may select 219 n-grams in the subset of n-grams to be included in the mapping table. If more or fewer n-grams are selected, the mapping table may include empty entries, or the mapping table may include as many entries as possible, with excess n-grams being excluded from the table.

The mapping table 500 in FIG. 5 illustrates a number of overlapping n-grams, such as "sion", "ion" and "on". In some embodiments, some of these overlapping n-grams may be removed or not included in the mapping table so that only one n-gram of the overlapping set is included in the mapping table. This may be because, although all of "sion" "ion" and "on" may have large calculated space saving amounts, the space savings may be largely cumulative, such that, for example, by including "sion" in the mapping table, the additional space savings due to "ion" may be much less than the calculated space savings amount due to the overlap.

In the embodiment illustrated in FIG. 5, the single characters are entered at the beginning of the mapping table 500, followed by the n-grams. The n-grams listed in the mapping table 500 are exemplary only, and in practice of the embodiment, the remainder of the table would typically be filled with n-grams.

In another embodiment, the mapping table may be based off of a standard ASCII table. That is, the single characters in the mapping table may retain their standard 1-byte ASCII representation, while unused characters in the ASCII table are replaced with selected n-grams. In this way, the single characters in the small strings may not need to be replaced with a unique code, because the unique code for single characters will be the same as the ASCII representation. Similarly, where other forms of character representation are used, such as Unicode, the mapping table may be designed to maintain the unique code for single characters.

Although embodiments illustrated in FIG. 5 include a single byte unique code, in other embodiments, multi-byte codes or variable length codes may be used. For example, a 2-byte unique code mapping table would include 65536 entries with codes from "0000" to "FFFF". 2-byte encoding may be used with small strings that are originally represented using Unicode. Three and four byte unique codes may be used, as well as any other length. In one embodiment, fixed bit-lengths may be used that are not complete bytes, such as 10 bits. Increasing the byte representation length allows more n-grams to be represented in the mapping table, which may further increase the compression capabilities of the algorithm, but increasing the byte representation length also increases the size of the mapping table, which may be required to be loaded in memory, thus increasing the memory requirements. These tradeoffs from increasing the byte representation length may be taken into consideration when determining which representation length to use for a particular application.

Embodiments of the disclosure are not limited to fixed length byte compression mapping, but can be performed with variable-length byte mapping. With a variable 1-2 byte representation, the first bit of the unique code may signal whether 1 or 2 bytes are being used, leaving 128 places in the 1 byte representation and 32768 places in the 2 byte representation. In some applications of small string compression, 1-byte and 1-2 byte variable length mapping have been found to be the most effective.

Variable length mapping may be especially effective in applications where the small strings include relatively few n-grams that appear with a high frequency. For example, in one embodiment, the small strings may be addresses. Some n-grams that may occur frequently in addresses may include "street", "drive", "lane", "boulevard", "north", "east", etc. These n-grams may be included in the 128 entries in the 1-byte portion of the mapping table because they will be used most frequently for compression. Other n-grams may be included in the 2-byte portion of the mapping table, which may not provide as much compression as the 1-byte portion, allows a much larger number of n-grams to be included. Thus, the variable length mapping may be more effective than strictly one or two byte mapping.

Advantages of using fixed length 1-byte encoding include that the maximization problem may be relatively easy to build and solve, the encoding and decoding may be relatively quick, and the memory requirements for the mapping table may be minimal. Advantages of using variable length encoding include a potential for better overall compression.

In a test compressing 100,000 domain names from the .com zone according to a method of an embodiment of the disclosure, a 35% size improvement was measured between the uncompressed and compressed domain names using a fixed length 1-byte encoding, and a 45% size improvement was measured using variable length 1-2 byte encoding. In the fixed length 1-byte case, only 2% of the domain names had the same length after compression, and in the variable length case, only 4% of the domain names had the same length after compression. None of the domain names was larger after compression using either scheme.

In one embodiment, the computer 101 may perform an additional step of determining the best byte representation scheme (1 byte encoding, 2 byte encoding, variable 1-2 byte encoding, etc.) for the unique codes prior to defining the mapping table. In one embodiment, the determination may be made by using at least two different byte representation schemes, comparing the compression obtained using the different representation schemes, and selecting the compression scheme that achieves the best compression. For example, given a set of small strings, the computer 101 may perform steps 220 to 250 using a 1-byte unique code and corresponding mapping table and determine a compression achieved using the 1-byte unique code. The computer 101 may then repeat steps 220 to 250 using a 2-byte unique code and corresponding mapping table and determine a compression achieved using the 2-byte unique code. The computer 101 may then select the representation scheme that achieved the best compression of the set of small strings. In another embodiment, the computer 101 may select the best unique code length based on other factors, for example, available memory for storing the mapping table, compatibility with other system components, unique code lengths used for similar sets of small strings, etc.

Figure 6:
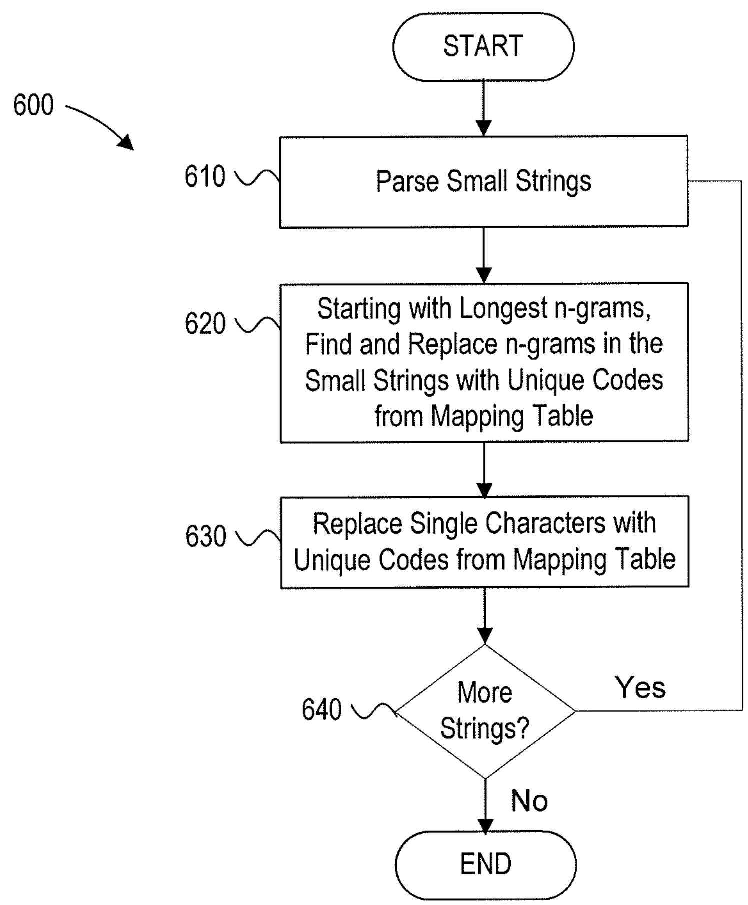
FIG. 6 is an exemplary illustration of a method for compressing the set of small strings.

FIG. 6 is an exemplary illustration of a method 600 for compressing the set of small strings according to embodiments of the disclosure. In step 610, the computer 101 may parse a small string. The computer 101 may parse the small string in order to match or identify n-grams within the small string that are also present in the mapping table.

In step 620, the computer 101 may replace n-gram strings in the small string with the corresponding unique codes from the mapping table, until no more n-gram strings are present in the small string that are also present in the mapping table. The computer 101 may replace larger n-grams first so that maximum compression may be achieved. The computer 101 may alternatively approach the replacement of n-gram strings as a knapsack problem, and use an appropriate knapsack algorithm to maximize the replacement of n-grams strings in the small string. Other resource allocation algorithms may be used in other embodiments.

In step 630, the computer 101 may then replace the remaining individual characters in the small string with the corresponding unique codes for the individual characters. In step 640, the computer 101 may determine whether all of the small strings within the set of small strings have been parsed and replaced with unique codes. If there are small strings that still need to be processed, operation of the method may return to step 610 where a next small string may be loaded and the method repeated. If all of the small strings in the set of small strings have been processed, operation of the method may end. In one embodiment, operation of the method may proceed to step 260 in FIG. 2 if all of the small strings have been processed.

The exact order and method of replacement of n-gram strings may be stored, and a later program searching for a small string may use the same replacement method to compress the search term. In this manner, the compressed set of small strings may be searched without decompressing or decoding the entire set.

An example of the steps 610 to 630 is provided below. In the example, the small string being compressed is "domainname", and a partial mapping table is included using 1-byte unique codes.

Parse Small String (Example 3)

| | | | | | | | | | |
|---|---|---|---|---|---|---|---|---|---|
| *d* | *o* | *m* | *a* | *i* | *n* | *n* | *a* | *m* | *e* |
| *do* | *om* | *ma* | *ai* | *in* | *nn* | *na* | *am* | *me* | |
| *dom* | *oma* | *mai* | *ain* | *inn* | *nna* | *nam* | *ame* | | |
| *doma* | *omai* | *main* | *ainn* | *inna* | *nnam* | name | | | |
| . . . | | | | | | | | | |
| *domainnam* | *omainname* | | | | | | | | |

| Partial Mapping Table |
|---|
| 00—do<br>01—ai<br>02—name |

In step 630 in Example 3, the string "domainname" would be compressed to (do)m(ai)n(name), where the strings in parentheses are represented by a unique code for the n-gram string, and the individual characters m and n would be represented by their unique code. The actual representation (using ASCII for the individual characters), may be "00 6D 01 6E 02". Thus, while "domainname" was originally represented using 10 bytes, after compression, it is represented using only 5 bytes.

In another embodiment, the small string may not be parsed in step 610, but instead entries in the mapping table may be sequentially compared to the small string to determine whether the n-gram entry is present in the small string.

Other embodiments of the invention will be apparent to those skilled in the art from consideration of the specification and practice of the invention disclosed herein. In particular, non-dependent steps may be performed in any order, or in parallel. It is intended that the specification and examples be considered as exemplary only, with a true scope and spirit of the invention being indicated by the following claims.

What is claimed is:

1. A computer-implemented method for compressing a set of small strings, the method comprising:

calculating, by a processor, n-gram frequencies for a plurality of n-grams over the set of small strings;

selecting, by the processor, a subset of n-grams from the plurality of n-grams based on the calculated n-gram frequencies;

defining, by the processor, a mapping table that maps each n-gram of the subset of n-grams to a unique code, wherein the unique codes are variable-length one or two byte codes; and compressing, by the processor, the set of small strings by replacing n-grams within each small string in the set of small strings with corresponding unique codes from the mapping table.

2. The method according to claim 1, the selecting further comprising:

calculating, by the processor, a space saving amount for each n-gram of the plurality of n-grams as a product of (1) the n-gram frequency and (2) a difference between a character length of the n-gram and a length of the unique codes; and selecting a number of the n-grams with the highest calculated space saving amount as the subset of n-grams.

3. The method according to claim 2, wherein overlapping n-grams are removed from the selected subset of n-grams.

4. The method according to claim 1, the selecting further comprising:

calculating, by the processor, a space saving amount for each n-gram of the plurality of n-grams as a product of (1) the n-gram frequency and (2) a difference between a character length of the n-gram and a length of the unique codes; and using linear optimization to determine and select the subset of n-grams from the plurality of n-grams that achieves a maximum space saving amount over the set of small strings;

wherein constraints for the linear optimization include as acting only one n-gram from a set of overlapping n-grams.

5. The method according to claim 1, the compressing further comprising:

for each small string in the set of small strings, replacing n-grams within the small string with corresponding unique codes from the mapping table starting with the longest n-gram appearing in both the small string and the mapping table first.

6. The method according to claim 1, wherein the set of small strings is a set of domain names.

7. A system for compressing a set of strings, the system comprising:

a processor; and a memory connected to the processor, the memory storing instructions to direct the processor to perform operations comprising:

calculating n-gram frequencies for a plurality of n-grams over the set of small strings;

selecting a subset of n-grams from the plurality of n-grams based on the calculated n-gram frequencies;

defining a mapping table that maps each n-gram of the subset of n-grams to a unique code, wherein the unique codes are variable-length one or two byte codes; and compressing the set of small strings by replacing n-grams within each small string in the set of small strings with corresponding unique codes from the mapping table.

8. The system according to claim 7, the selecting further comprising:

calculating a space saving amount for each n-gram of the plurality of n-grams as a product of (1) the n-gram frequency and (2) a difference between a character length of the n-gram and a length of the unique codes; and using linear optimization to determine and select the subset of n-grams from the plurality of n-grams that achieves a maximum space saving amount over the set of small strings;

wherein constraints for the linear optimization include selecting only one n-gram from a set of overlapping n-grams.

9. The system according to claim 7, the selecting further comprising:

calculating a space saving amount for each n-gram of the plurality of n-grams as a product of (1) the n-gram frequency and (2) a difference between a character length of the n-gram and a length of the unique codes; and selecting a number of the n-grams with the highest calculated space saving amount as the subset of n-grams.

10. The system according to claim 9, wherein overlapping n-grams are removed from the selected subset of n-grams.

11. A non-transitory computer-readable storage medium storing instructions for compressing a set of small strings, the instructions causing one or more computer processors to perform operations according to a method, the method comprising:

calculating n-gram frequencies for a plurality of n-grams over the set of small strings;

selecting a subset of n-grams from the plurality of n-grams based on the calculated n-gram frequencies;

defining a mapping table that maps each n-gram of the subset of n-grams to a unique code, wherein the unique codes are variable-length one or two byte codes; and compressing the set of small strings by replacing n-grams within each small string in the set of small strings with corresponding unique codes from the mapping table.

12. The non-transitory computer-readable storage medium according to claim 11, the selecting further comprising:

calculating a space saving amount for each n-gram of the plurality of n-grams as a product of (1) the n-gram frequency and (2) a difference between a character length of the n-gram and a length of the unique codes; and using linear optimization to determine and select the subset of n-grams from the plurality of n-grams that achieves a maximum space saving amount over the set of small strings;

wherein constraints for the linear optimization include selecting only one n-gram from a set of overlapping n-grams.

13. The non-transitory computer-readable storage medium according to claim 11, the selecting further comprising:

calculating a space saving amount for each n-gram of the plurality of n-grams as a product of (1) the n-gram frequency and (2) a difference between a character length of the n-gram and a length of the unique codes; and selecting a number of the n-grams with the highest calculated space saving amount as the subset of n-grams.

14. The non-transitory computer-readable storage medium according to claim 13, wherein overlapping n-grams are removed from the selected subset of n-grams.

15. A computer-implemented method for compressing a set of small strings, the method comprising:

calculating, by a processor, n-gram frequencies for a plurality of n-grams over the set of small strings;

selecting, by the processor, a subset of n-grams from the plurality of n-grams based on the calculated n-gram frequencies;

defining, by the processor, a mapping table that maps each n-gram of the subset of n-grams to a unique code;

determining, by the processor, an optimum length for the unique codes, the determining including:

calculating a space saving amount over a subset of small strings from the set of small strings for each of at least two different unique code lengths, wherein the at least two different unique code lengths includes: (1) fixed single byte codes, (2) fixed 2-byte codes, and (3) variable-length one or two byte codes; and selecting as the optimum length the unique code length with the maximum space saving amount over the subset of small strings, wherein the unique codes are the optimum length; and compressing, by the processor, the set of small strings by replacing n-grams within each small string in the set of small strings with corresponding unique codes from the mapping table.

16. The method according to claim 15, wherein the subset of small strings from the set of small strings includes the whole set of small strings.

17. A system for compressing a set of small strings, the system comprising:

a processor; and a memory connected to the processor, the memory storing instructions to direct the processor to perform operations comprising:

calculating n-gram frequencies for a plurality of n-grams over the set of small strings;

selecting a subset of n-grams from the plurality of n-grams based on the calculated n-gram frequencies;

defining a mapping table that maps each n-gram of the subset of n-grams to a unique code;

determining an optimum length for the unique codes, the determining including:

calculating a space saving amount over a subset of small strings from the set of small strings for each of at least two different unique code lengths, wherein the at least two different unique code lengths includes: (1) fixed single byte codes, (2) fixed 2-byte codes, and (3) variable-length one or two byte codes; and selecting as the optimum length the unique code length with the maximum space saving amount over the subset of small strings, wherein the unique codes are the optimum length; and compressing the set of small strings by replacing n-grams within each small string in the set of small strings with corresponding unique codes from the mapping table.

18. The system according to claim 17, wherein the subset of small strings from the set of small strings includes the whole set of small strings.

19. A non-transitory computer-readable storage medium storing instructions for compressing a set of small strings, the instructions causing one or more computer processors to perform operations according to a method, the method comprising:

calculating n-gram frequencies for a plurality of n-grams over the set of small strings;

selecting a subset of n-grams from the plurality of n-grams based on the calculated n-gram frequencies;

defining a mapping table that maps each n-gram of the subset of n-grams to a unique code;

determining an optimum length for the unique codes, the determining including:

calculating a space saving amount over a subset of small strings from the set of small strings for each of at least two different unique code lengths, wherein the at least two different unique code lengths includes: (1) fixed single byte codes, (2) fixed 2-byte codes, and (3) variable-length one or two byte codes; and selecting as the optimum length the unique code length with the maximum space saving amount over the subset of small strings, wherein the unique codes are the optimum length; and compressing the set of small strings by replacing n-grams within each small string in the set of small strings with corresponding unique codes from the mapping table.

20. The non-transitory computer-readable storage medium according to claim 19, wherein the subset of small strings from the set of small strings includes the whole set of small strings.

* * * * *